United States Patent
Bhatia et al.

(10) Patent No.: US 10,721,838 B1
(45) Date of Patent: Jul. 21, 2020

(54) STACKED BASE HEAT SINK WITH HEAT PIPES IN-LINE WITH AIRFLOW

(71) Applicant: CISCO TECHNOLOGY, INC., San Jose, CA (US)

(72) Inventors: Rakesh Bhatia, San Jose, CA (US); Eric Michael Lotter, Gilroy, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/198,542

(22) Filed: Nov. 21, 2018

(51) Int. Cl.
| | |
|---|---|
| *H05K 7/20* | (2006.01) |
| *H05K 1/18* | (2006.01) |
| *H05K 1/02* | (2006.01) |
| *H01L 23/467* | (2006.01) |
| *H01L 23/367* | (2006.01) |

(52) U.S. Cl.
CPC ....... *H05K 7/20409* (2013.01); *H05K 1/0203* (2013.01); *H05K 1/181* (2013.01); *H05K 7/20154* (2013.01); *H05K 7/20172* (2013.01); *H05K 7/20336* (2013.01); *H05K 7/20727* (2013.01); *H05K 7/20809* (2013.01); *H01L 23/367* (2013.01); *H01L 23/467* (2013.01); *H05K 2201/064* (2013.01); *H05K 2201/066* (2013.01)

(58) Field of Classification Search
None
See application file for complete search history.

(56) References Cited

U.S. PATENT DOCUMENTS

| | | | | |
|---|---|---|---|---|
| 6,189,601 | B1 * | 2/2001 | Goodman | F28D 15/0233 165/104.33 |
| 7,021,368 | B2 * | 4/2006 | Lin | H01L 23/427 165/104.33 |
| 7,269,014 | B1 * | 9/2007 | Zhao | H01L 23/4006 165/104.33 |
| 7,347,251 | B2 | 3/2008 | Foster et al. | |
| 7,597,133 | B2 | 10/2009 | Lee et al. | |
| 7,643,293 | B2 * | 1/2010 | Chu | F28D 15/0275 361/700 |
| 7,697,293 | B1 * | 4/2010 | Peng | H01L 23/427 165/104.26 |
| 2004/0226696 | A1 | 11/2004 | Huang et al. | |
| 2004/0226697 | A1 * | 11/2004 | Liu | F28D 15/0275 165/104.33 |
| 2005/0092465 | A1 * | 5/2005 | Lin | F28D 15/0275 165/104.21 |
| 2005/0183849 | A1 * | 8/2005 | Ko | F28D 15/0275 165/104.33 |
| 2006/0032616 | A1 * | 2/2006 | Yang | H01L 23/427 165/104.33 |
| 2008/0169089 | A1 * | 7/2008 | Wu | H01L 23/427 165/104.33 |

(Continued)

FOREIGN PATENT DOCUMENTS

TW    M277981    10/2005

*Primary Examiner* — Courtney L Smith
(74) *Attorney, Agent, or Firm* — Cindy Kaplan

(57) ABSTRACT

In one embodiment, a heat sink includes a lower base, an upper base, a set of fins interposed between the lower base and the upper base, and a plurality of heat pipes running between the lower base and the upper base on opposite sides of the heat sink and in-line with an airflow direction through the set of fins. An apparatus comprising a plurality of the heat sinks is also disclosed herein.

20 Claims, 4 Drawing Sheets

(56) References Cited

U.S. PATENT DOCUMENTS

2009/0145582 A1* 6/2009 Yang .................... F28D 15/0275
                                                      165/104.21
2009/0166009 A1* 7/2009 Xu ...................... H01L 23/3672
                                                      165/104.33

* cited by examiner

STACKED BASE HEAT SINK WITH HEAT PIPES IN-LINE WITH AIRFLOW

TECHNICAL FIELD

The present disclosure relates generally to heat dissipating devices, and more particularly, to stacked base heat sinks.

BACKGROUND

Over the past several years, there has been a tremendous increase in the need for higher performance communications networks. Increased performance requirements have led to an increase in energy use resulting in greater heat dissipation from components. Heat sinks are widely used to accommodate the large thermal dissipation of many semiconductor devices.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1A:
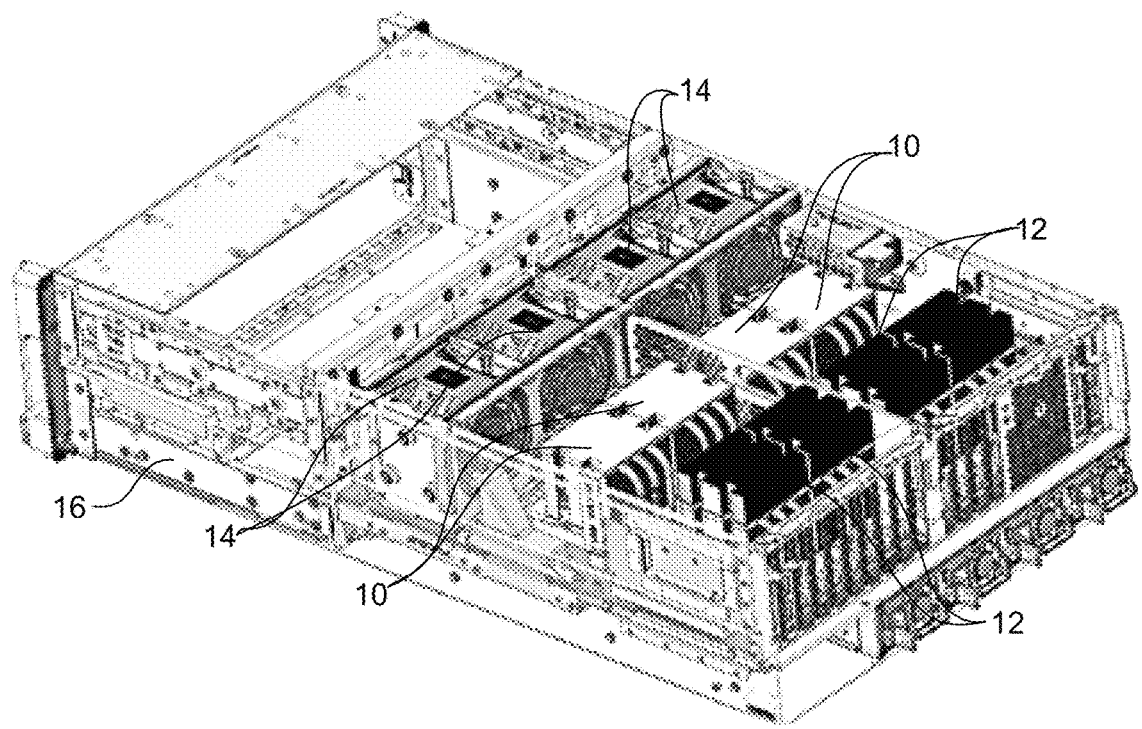
FIG. 1A is a perspective of a chassis with parts removed to illustrate heat sinks installed in the chassis, in accordance with one embodiment.

In one embodiment, a heat sink generally comprises a lower base, an upper base, a set of fins interposed between the lower base and the upper base, and a plurality of heat pipes running between the lower base and the upper base on opposite sides of the heat sink and in-line with an airflow direction through the set of fins.

In one or more embodiments, an equal number of heat pipes are located on opposite sides of the heat sink. In one embodiment, three heat pipes may be located on each of the opposite sides of the heat sink.

In one or more embodiments, a lower surface of the upper base comprises grooves for receiving the heat pipes. The lower base may comprise openings for the heat pipes to pass therethrough.

In one or more embodiments, a second set of fins is mounted on the upper base, the second set of fins having a smaller height than the set of fins interposed between the lower base and the upper base.

In another embodiment, a heat sink generally comprises a lower base, an upper base, a set of fins interposed between the lower base and the upper base, a second set of fins mounted on top of the upper base, and a plurality of heat pipes running between the lower base and the upper base on opposite sides of the heat sink and in-line with an airflow direction through the sets of fins.

In yet another embodiment, an apparatus generally comprises a printed circuit board with two rows of processors, a plurality of fans positioned adjacent to a first row of the processors, and a plurality of heat sinks mounted on the processors. Each of the heat sinks comprises a lower base, an upper base, a set of fins interposed between the lower base and the upper base, and a plurality of heat pipes running between the lower base and the upper base on opposite sides of the heat sink and in-line with an airflow direction through the set of fins. The heat sinks mounted on a second row of the processors further comprise a second set of fins stacked on top of the upper base.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices such as server systems include many semiconductor chips (e.g., CPUs (Central Processing Units), GPUs (Graphics Processing Units), or semiconductor devices), which often use heat sinks to dissipate thermal energy generated by the chips. Currently, the power from some of these devices is about 300 Watts and the trend has been for power to go up. As communications systems speeds and power requirements increase, the emission from electronic components increases along with a need for improved cooling. In order to properly cool the high power components and maintain their temperatures under rated thermal specifications, heat sinks are implemented for use with air cooling from fans. In one example, the heat sink includes at least one set of fins with fin efficiency defined as a measure of the temperature drop from a heat sink base to a tip of the heat sink. As the fin height increases, thicker material may be needed to improve fin efficiency. As the fin thickness increases, fewer fins are used to prevent air pressure losses arising from lower air gaps from becoming too large for system fans to drive air through the fins. Alternate designs are therefore needed to further improve fin efficiency.

The embodiments described herein improve upon thermal performance of heat sinks used for high power devices, and particularly tall heat sinks. In one or more embodiments stacked base heat sinks are implemented to achieve high power device cooling under various thermal environments. In one or more embodiments, fin efficiency is improved over conventional heat sinks and the overall cooling design efficiency is improved as compared to conventional implementations. Improvements in energy efficiency are provided as the cooling fans may operate at slower speeds to achieve the same level of cooling as in conventional designs. The embodiments provide improved fin efficiency and thermal performance.

The embodiments described herein operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. One or more of the network devices may comprise one or more fans and heat sinks as described herein to provide cooling to electronic components (e.g., processors (GPUs CPUs) or other semiconductor devices) of the network device (e.g., server, router, switch, or other network device). The network device may further include any combination of memory, processors, power supply units, and network interfaces.

Figure 1B:
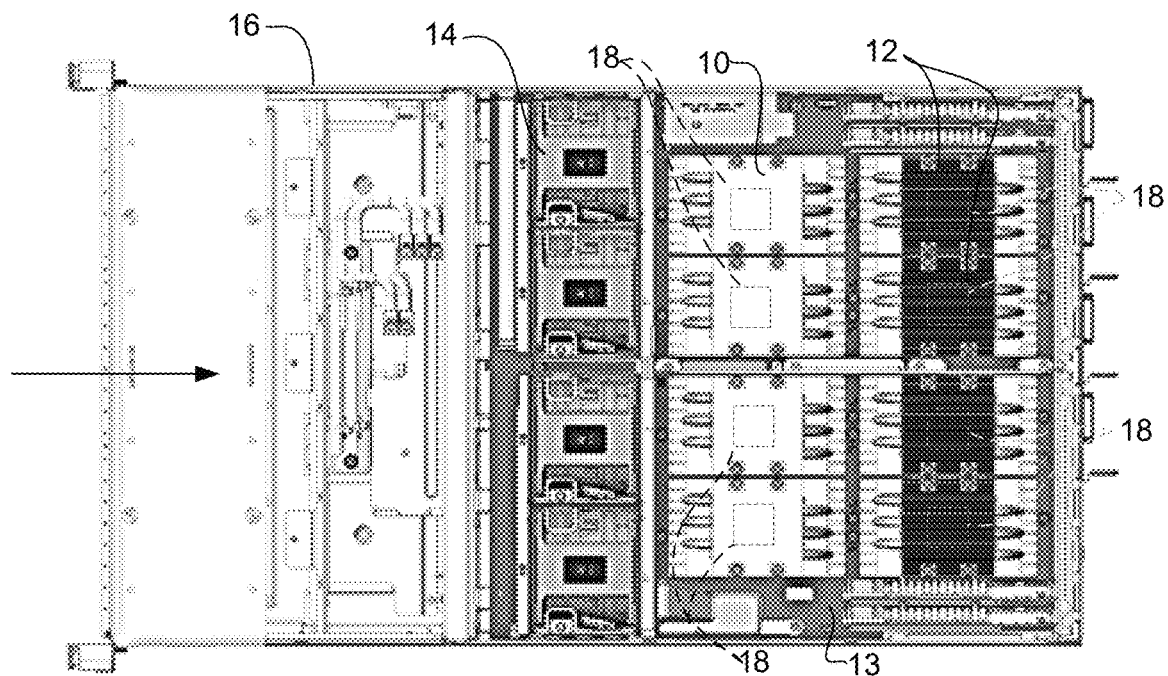
FIG. 1B is a top view of the heat sinks installed in the chassis shown in FIG. 1A.

Referring now to the drawings, and first to FIGS. 1A and 1B, stacked heat sinks 10, 12 are shown arranged in rows behind a plurality of cooling fans 14 in a chassis 16. The direction of air flow through the chassis is indicated by the arrow in FIG. 1B. The heat sinks 10, 12 are configured to maximize the surface area in contact with a cooling medium (e.g., air) surrounding the heat sink. The heat sinks 10, 12 transfer heat generated by electronic components (e.g., processors) 18 (shown in phantom positioned under the heat sinks in FIG. 1B) where heat dissipation capability of the component is insufficient to moderate its temperature. As described in detail below, the heat sinks 10, 12 include at least two bases, heat pipes in contact with the bases, and one or more sets of fins, which allow excess thermal energy to dissipate into the environment by conduction and convection. The heat sink 10, 12 carries heat away from the electronic device 18 into fins that provide a large surface area for the heat to dissipate, thus cooling the heat sink and electronic device. The electronic device (processor, chip) 18 may comprise, for example, a CPU, GPU, or other electronic component that generates thermal energy. The heat sink 10, 12 may be formed from any suitable material (e.g., copper, aluminum) and have any shape (e.g., height, width, length, base footprint, base thickness, number of fins, size of fins).

The processors 18 and heat sinks 10, 12 are installed on one or more printed circuit boards 13 comprising any number of electronic components (FIG. 1B). The printed circuit board 13 provides a dielectric material for copper or other conductive traces. The traces and pads are embedded within or deposited on the printed circuit board 13 for connection with the electronic components. Etching, deposition, bonding, or other processes may be used to form the traces, pads, or embedded components (e.g., passive or active devices). The printed circuit board 13 may include one or more active devices (e.g., transistor, chip, processor, circuit, application specific integrated circuit, field programmable gate array, memory, etc.) and one or more passive devices (e.g., capacitor, resistor, inductor, connector, via, pad, etc.). Vias may be provided for routing traces through layers of the printed circuit board. The traces, pads, and electronic components may be arranged in any configuration to perform any number of functions (e.g., network server card, graphics card, motherboard, device card, and the like), or any other electronic part of a computer, router, switch, server, or other network device.

One or more heat sinks 10, 12 may be attached to the printed circuit board 13 and positioned over (mounted on) one or more heat generating devices (e.g., processors 18). The heat sinks 10, 12 may be held down on the printed circuit board by any suitable means (e.g., spring loaded screws, hold down clips, or other suitable fasteners). The heat sinks 10, 12 may be attached to the printed circuit board 13 for operation on any type of network device.

In the example shown in FIGS. 1A and 1B, four heat sinks 10 are arranged in a first row behind a row of four cooling fans 14 and four heat sinks 12 are arranged in a second row behind the first row of heat sinks 10. The heat sinks 10 each include one set of fins, as described below with respect to FIGS. 2A and 2B. The heat sinks 12 each include two sets of fins, as described below with respect to FIGS. 3A and 3B. Each of the heat sinks 10, 12 include stacked bases and a plurality of heat pipes, as described in detail below. Since the processors 18 in the rear (second row of processors below mounted heat sinks 12) are in the airflow shadow of the front processors (first row of processors), the rear processors will get air preheated from the front processors. The front heat sinks 10 are configured to be shorter in height than the rear heat sinks 12 to achieve similar cooling performance between the front and rear processors 18. The second set of stacked fins in the second row of heat sinks 12 make the heat sinks taller than the heat sinks 10 in the first row (interposed between the fans 14 and the heat sinks 12). This allows additional cooling air from the fans 14 to pass over the heat sinks 10 and through the stacked fins on the back row of heat sinks 12.

It is to be understood that the chassis shown in FIGS. 1A and 1B and the layout and arrangement of components including cooling fans 14 and heat sinks 10, 12 is only an example and the heat sinks 10, 12 may be used in other arrangements. For example, the network device may include only one row of heat sinks 10 or heat sinks 12 or any number or combination of heat sinks 10, 12, with any number or arrangement of cooling fans 14. Also, as noted below, any number of sets of fins may be stacked with two or more bases to increase the height and cooling performance of the heat sink.

It should be noted that the terms, bottom, top, upper, lower, and the like as used herein are relative terms dependent upon the orientation of the heat sink and network device and should not be interpreted in a limiting manner.

Figure 2A:
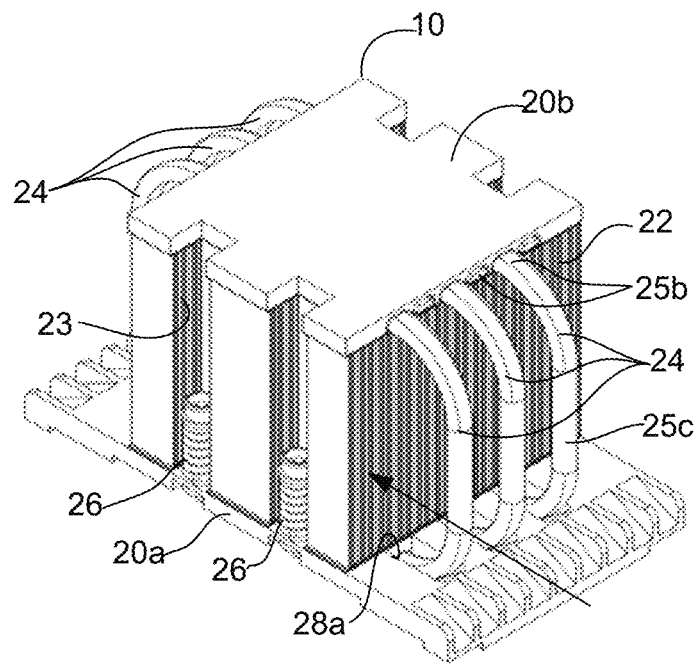
FIG. 2A is a top perspective of a stacked base heat sink with one set of fins in accordance with one embodiment.
Figure 2B:
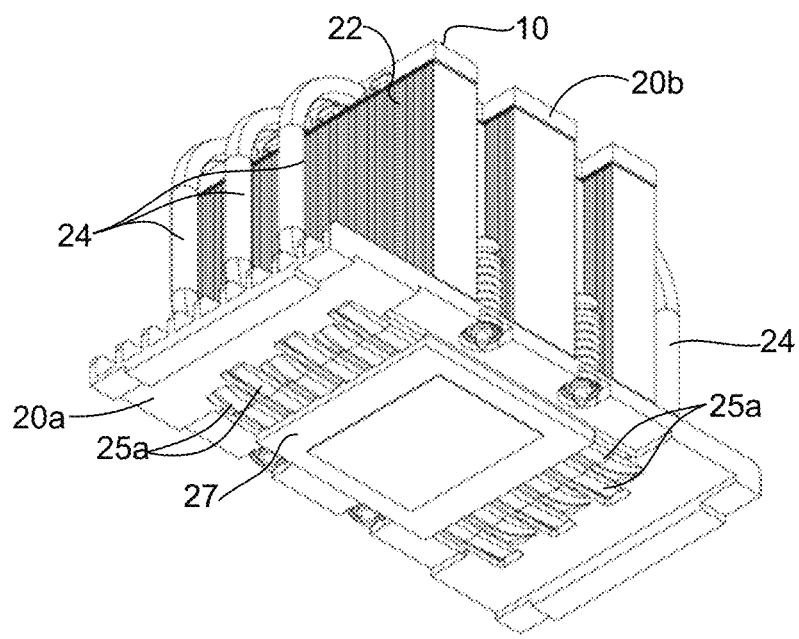
FIG. 2B is a bottom perspective of the stacked base heat sink shown in FIG. 2A.

Referring now to FIGS. 2A and 2B, the front stacked base heat sink 10 is shown, in accordance with one embodiment. The heat sink 10 incorporates two heat sink bases (plates); one base 20a on the bottom, which makes contact with the heat generating device (processor 18 in FIG. 1B), and another base 20b stacked on the top of fins 22. The base plates 20a, 20b are positioned parallel to one another. Each base 20a, 20b is formed from a metallic heat-conductive material (e.g., aluminum, copper, or other suitable material). The bottom (lower) base 20a and the top (upper) base 20b are connected via a single group (set) of fins (fin pack) 22. The individual fins are parallel and spaced from one another and sandwiched between the bottom base plate 20a and the top base plate 20b.

Figure 3A:
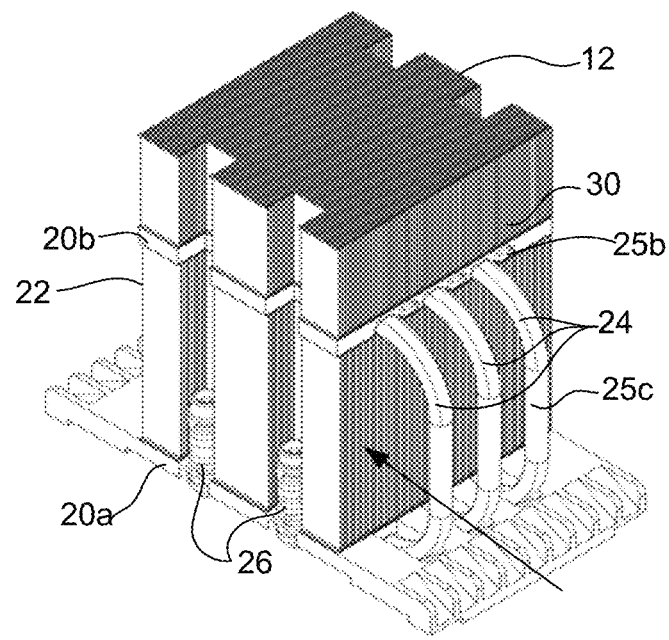
FIG. 3A is a top perspective of a stacked base heat sink with two sets of fins, in accordance with one embodiment.
Figure 3B:
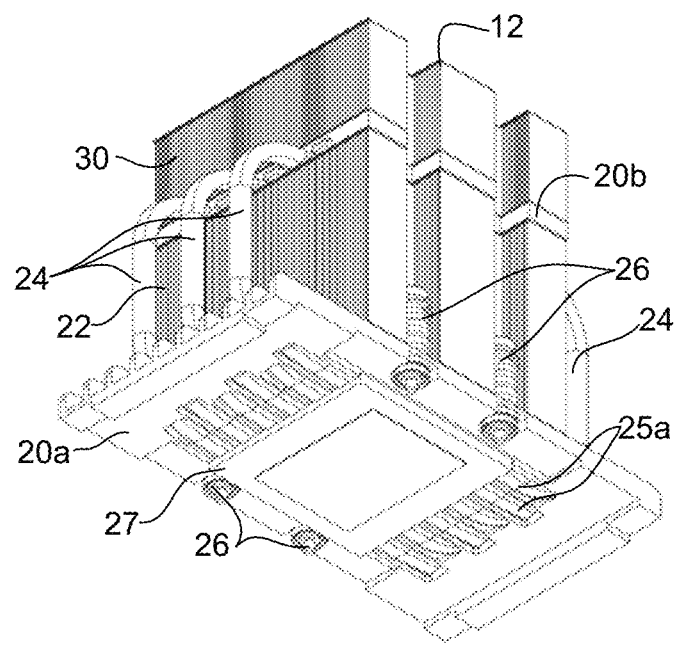
FIG. 3B is a bottom perspective of the stacked base heat sink shown in FIG. 3A.

The two bases 20a, 20b are thermally connected through a plurality of heat pipes 24 that originate from the lower base 20a and terminate in the upper base 20b. The thermal path of the heat pipes 24 run in-line with the fins 22 and air flow direction (indicated by arrow in FIG. 2A). Thus, legs 25a, 25b of the heat pipes 24 run generally parallel to the fins with central portions 25c of the heat pipes located on the sides of the heat sink on which the air flow enters or exits. The direction of the heat pipes 24 also minimizes the width of the package in a direction perpendicular to the airflow direction, and prevents gaps or slices from being taken out of the fin packet to accommodate the heat pipes. The heat pipes 24 operate as thermal transportation devices between the bases 20a, 20b, which act as thermal dissipation/diffusers, dissipating the thermal energy from the lower base 20a to the upper base 20b (then to the top of the fins in the case of a second stacked set of fins as shown in FIGS. 3A and 3B). Some energy may also get transferred directly from the heat pipes 24 to the fins 22.

In the example shown in FIGS. 2A and 2B, six heat pipes extend between the bottom base 20a and top base 20b, with three heat pipes located on opposite sides of the fins 22. Each of the heat pipes 24 is U-shaped comprising a central portion 25c connecting legs 25a, 25b extending outward therefrom generally parallel to one another. The lower legs 25a extend through openings 28a in the lower base 20a and the upper legs 25b extend along grooves formed in the upper base 20b, as described below.

The lower base 20a comprises a plurality of openings 28a for receiving the legs 25a of the heat pipes (FIGS. 2A and 2B). As shown in FIG. 2B, the lower legs 25a of the heat pipes 24 pass through the openings formed in the lower base 20a and extend generally parallel to a lower surface of the lower base. A plate 27 mates with a lower surface of the bottom plate and comprises a plurality of grooves (described below with respect to FIG. 4) for receiving the legs 25a of the heat pipes and forming channels for the heat pipes to pass through. An inner surface (facing the fins 22) of the top base 20b comprises a plurality of grooves (shown in FIG. 4) for receiving upper legs 25b of the heat pipes 24. The grooves extend from one side of the upper base 20b to an opposite side of the base to allow the legs 25b to extend along the length of the base.

The heat sink 10 may attached to the printed circuit board 13 (FIG. 1B) (or processor socket or other mounting structure) with four spring loaded screws 26. Any other suitable fastener or number or arrangement of the spring loaded screws 26 may be used. Recesses 26 are formed in the fin set 22 to provide access to the screws with a screwdriver or other tool. In this example, the screws 26 are located on sides adjacent to the sides on which the heat pipes 24 are located. Thus, the heat sink 10 may be mounted on (i.e., positioned over) the processor 18 using any suitable mounting structure or fastening means.

As previously noted, another set of fins may be stacked on top of the upper base plate 20b, as shown in FIGS. 3A and 3B.

Referring now to FIGS. 3A and 3B, the stacked base and fin heat sink 12 is shown, in accordance with one embodiment. A second fin pack 30 is assembled on a top side of the upper base 20b and thereby extends the total height of the heat sink 12. As previously described, the heat pipes 24 extend through grooves formed in a lower surface of the upper base 20b, thereby providing a flat mounting surface for stacking the second set of fins 30 on the upper base. The addition of another fin set 30 further increases the fin efficiency for taller heat sinks. This approach provides improved efficiency over using a taller fin and placing the upper base on top of the taller fins. Also, manufacturing efficiencies and cost benefits are provided by sharing components (e.g., lower and upper bases 20a, 20b, first set of fins 22, heat pipes 24) between the front and rear heat sinks 10, 12

The use of at least two heat sink bases 20a, 20b allow for the use of lower thickness fins 22 while increasing fin efficiency (FIGS. 2A, 2B, 3A, and 3B). Both of the bases, one on the bottom 20a, which is in contact with the electronic device (processor) being cooled, and the one on the top 20b, which is connected to the bottom base using the heat pipes 24, conduct heat into the fins 22 from the two sides. In one or more embodiments, another base may be added on top of the second fin set 30 with another set of heat pipes extending from the bottom base 20a to the third (upper most base).

Figure 4:
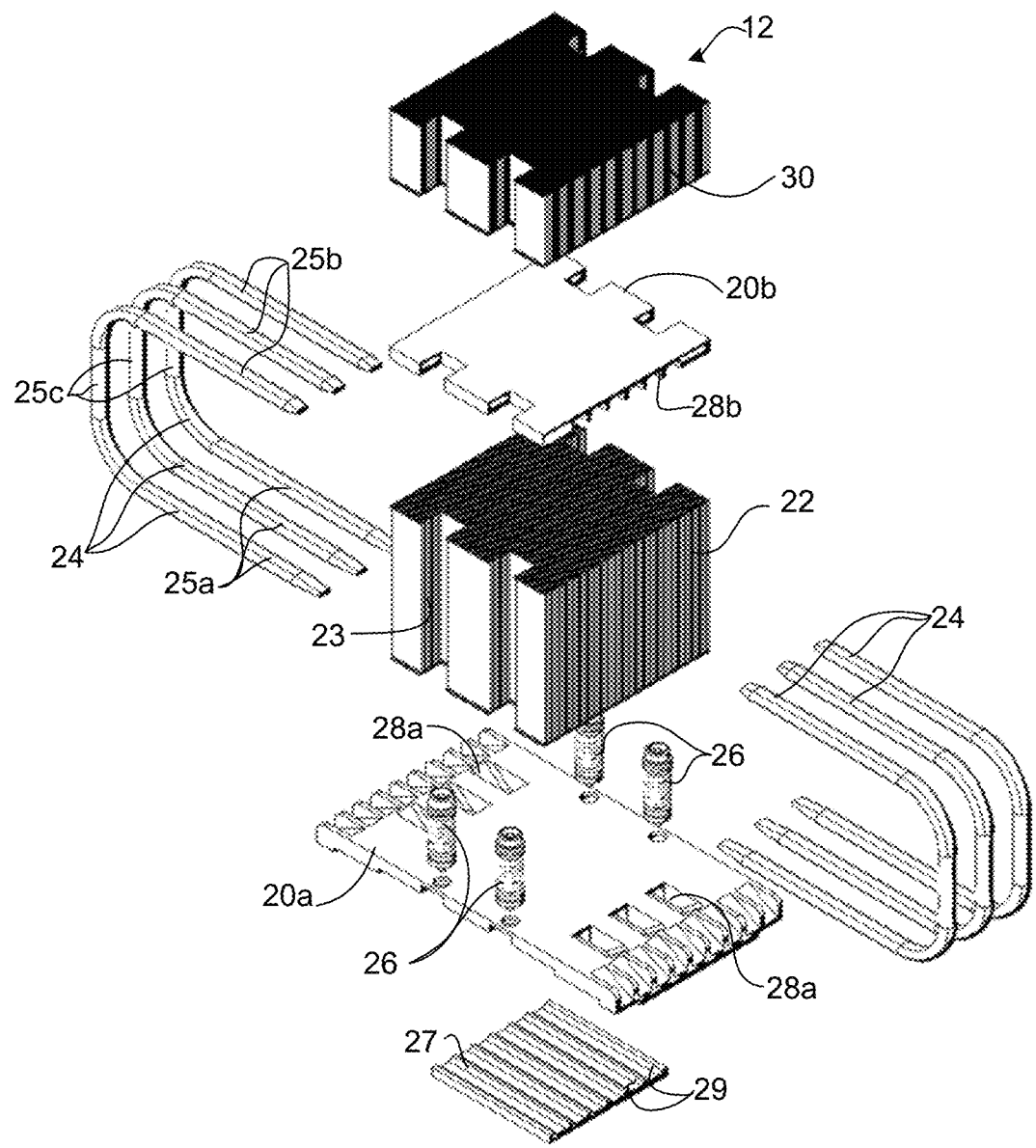
FIG. 4 is an exploded view of the heat sink shown in FIGS. 3A and 3B.

FIG. 4 is an exploded view of the heat sink 12 shown in FIGS. 3A and 3B. As previously described, the U-shaped heat pipes 24 comprise leg portions 25a, 25b at each end for insertion into openings 28a in the lower base 20a and grooves (channels) 28b in the upper base 20b. Plate 27 includes U-shaped grooves 29 forming channels for receiving the lower legs 25a of the heat pipes to position the heat pipes for receiving heat from the processor 18 (FIG. 1). The four spring loaded screws 26 are shown for mounting the heat sink 12 on the printed circuit board with the processor 18 interposed therebetween (FIGS. 4 and 1B).

It is to be understood that the heat sink configurations shown in FIGS. 2A, 2B, 3A, 3B and 4 are only examples and that variations may be made without departing from the scope of the embodiments. For example, additional bases or fins may be stacked on the heat sink and additional heat pipes may be used between the bottom base and any of the other bases. For example, in one or more embodiments, a base may be added approximately every 50 mm of heat sink height for optimum performance. Also, the number of heat pipes 24 may be different than shown. For example, one pair of heat pipes may be used in-line with the airflow on opposite sides of the heat sink or any other number of heat pipes. In the examples shown herein an equal number of heat pipes 24 are located on opposite sides of the heat sink. The number of heat pipes may also vary between sides.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. A heat sink comprising:
   a lower base;
   an upper base;
   a set of fins interposed between the lower base and the upper base; and
   a plurality of heat pipes, wherein at least one of said plurality of heat pipes extends from the lower base to the upper base on a first side of the heat sink and at least one other of said plurality of heat pipes extends from the lower base to the upper base on an opposite side of the heat sink, and wherein said plurality of heat pipes run in-line with the set of fins and with an airflow direction through the set of fins.

2. The heat sink of claim 1 wherein the plurality of heat pipes comprises at least three heat pipes running between the lower base and the upper base.

3. The heat sink of claim 1 wherein a lower surface of the upper base comprises grooves for receiving the heat pipes.

4. The heat sink of claim 1 wherein the lower base comprises openings for the heat pipes to pass through from an upper surface of the lower base to a lower surface thereof.

5. The heat sink of claim 1 wherein a second set of fins is stacked on the upper base, said second set of fins having a smaller height than the set of fins interposed between the lower base and the upper base.

6. The heat sink of claim 1 wherein said plurality of heat pipes comprise an equal number of the heat pipes on opposite sides of the heat sink.

7. A heat sink comprising:
a lower base;
an upper base;
a set of fins interposed between the lower base and the upper base;
a second set of fins stacked on top of the upper base; and
a plurality of heat pipes, wherein at least one of said plurality of heat pipes extends from the lower base to the upper base on a first side of the heat sink and at least one other of said plurality of heat pipes extends from the lower base to the upper base on an opposite side of the heat sink, and wherein said plurality of heat pipes run in-line with the sets of fins and with an airflow direction through the sets of fins.

8. The heat sink of claim 7 wherein the plurality of heat pipes comprises at least three heat pipes running between the lower base and the upper base on each of said opposite sides of the heat sink.

9. The heat sink of claim 7 wherein a lower surface of the upper base comprise grooves for receiving the heat pipes and the lower base comprises openings for the heat pipes to pass through from an upper surface of the lower base to a lower surface thereof.

10. The heat sink of claim 7 wherein said second set of fins has a smaller height than the set of fins interposed between the lower base and the upper base.

11. The heat sink of claim 7 wherein said plurality of heat pipes comprises an equal number of the heat pipes on opposite sides of the heat sink.

12. An apparatus comprising:
a printed circuit board with two rows of processors;
a plurality of fans positioned adjacent to a first row of the processors;
a plurality of heat sinks mounted on the processors, each of the heat sinks comprising:
a lower base;
an upper base;
a set of fins interposed between the lower base and the upper base; and
a plurality of heat pipes running between the lower base and the upper base on opposite sides of the heat sink and in-line with an airflow direction through the set of fins;
wherein the heat sinks mounted on a second row of the processors further comprise a second set of fins stacked on top of the upper base.

13. The apparatus of claim 12 wherein the height of the set of fins interposed between the lower base and the upper base is the same for all of the heat sinks.

14. The apparatus of claim 12 wherein the processors comprise graphics processing units and the apparatus comprises a server.

15. The apparatus of claim 12 wherein each of the rows of processors comprise four of the processors.

16. The apparatus of claim 12 wherein the plurality of heat pipes comprises three heat pipes on each of said opposite sides of the heat sink.

17. The apparatus of claim 12 wherein a lower surface of the upper base comprises grooves for receiving the heat pipes.

18. The apparatus of claim 12 wherein the heat pipes pass through openings in the lower base and wherein a plate comprising a plurality of grooves for receiving the heat pipes is attached to a lower surface of the lower base.

19. The apparatus of claim 12 wherein said second set of fins has a smaller height than the set of fins interposed between the lower base and the upper base.

20. The apparatus of claim 12 wherein an equal number of the heat pipes are located on opposite sides of the heat sink.

\* \* \* \* \*